United States Patent
Nagano

(10) Patent No.: US 6,809,984 B2
(45) Date of Patent: Oct. 26, 2004

(54) MULTIPORT MEMORY CIRCUIT COMPOSED OF 1TR-1C MEMORY CELLS

(75) Inventor: Hideo Nagano, Tokyo (JP)

(73) Assignee: Renesas Technology Corp., Chiyoda-ku (JP)

( * ) Notice: Subject to any disclaimer, the term of this patent is extended or adjusted under 35 U.S.C. 154(b) by 0 days.

(21) Appl. No.: 10/408,237

(22) Filed: Apr. 8, 2003

(65) Prior Publication Data

US 2004/0066697 A1 Apr. 8, 2004

(30) Foreign Application Priority Data

Oct. 3, 2002 (JP) ........................................ 2002-291499

(51) Int. Cl.[7] ................................................ G11C 8/00
(52) U.S. Cl. ............................ 365/230.05; 365/230.03; 365/233; 365/49; 365/189.01
(58) Field of Search ....................... 365/230.05, 230.03, 365/233, 49, 189.01

(56) References Cited

U.S. PATENT DOCUMENTS 6,160,733 A * 12/2000 Ebel ............................ 365/154
6,333,670 B1 * 12/2001 Kono et al. .................. 327/541
6,574,163 B2 * 6/2003 Maeda ........................ 365/233

FOREIGN PATENT DOCUMENTS

| JP | 58-130494 A | 8/1983 |
|---|---|---|
| JP | 62-287498 A | 12/1987 |
| JP | 05-198168 A | 8/1993 |
| JP | 05-206398 A | 8/1993 |
| JP | 07-296585 A | 11/1995 |
| JP | 10-283769 A | 10/1998 |
| JP | 2001-043674 A | 2/2001 |

\* cited by examiner

*Primary Examiner*—Connie C. Yoha
(74) *Attorney, Agent, or Firm*—Burns, Doane, Swecker & Mathis, L.L.P.

(57) ABSTRACT

A multiport memory circuit includes an access address selecting circuit for asserting a word line of an address that is subjected to write operation or read operation; refresh circuits, each of which is asserted when data of a corresponding memory cell is at an "L" level to rewrite the "L" level data back to the memory cell via a read bit line; a write/read bit-line selecting circuit for selecting, under the control of a write/read switching circuit, one of transferring write data to the bit lines and transferring data on the bit lines to the sense amplifiers; and a frequency multiplier for generating an internal clock signal with a frequency equal to or greater than double the higher frequency of the write clock signal and read clock signal. It can reduce the area of the memory cells and hence the chip size.

6 Claims, 10 Drawing Sheets

FIG.5

| | |
|---|---|
| "H" DATA WRITE | IN "H" DATA WRITE OPERATION, WRITE DRIVERS WRITE "H" DATA TO BIT LINES AT ONLY SELECTED ADDRESS. |
| "L" DATA WRITE | IN "L" DATA WRITE OPERATION, WRITE DRIVERS WRITE "L" DATA TO BIT LINES AT ONLY SELECTED ADDRESS. |
| "H" DATA READ | IN "H" DATA READ OPERATION, BIT LINES ARE PRECHARGED TO "H" LEVEL, AND DATA OF MEMORY CELLS ARE TRANSFERRED TO BIT LINES BY ENABLING WORD LINE WL AT ONLY SELECTED ADDRESS. HOWEVER, SINCE POTENTIALS OF BOTH BIT LINES AND MEMORY CELLS 70 ARE "H" LEVEL, THEY DO NOT VARY. ACCORDINGLY, DATA OF MEMORY CELLS 70 IS NOT DESTROYED, MAINTAINING "H" LEVEL. WHEN WORD LINE WL IS ENABLED, SENSE AMPLIFIERS ARE ENABLED SIMULTANEOUSLY, AND DATA IS TRANSFERRED TO OUTPUT CIRCUIT. WHEN OUTPUT OF SENSE AMPLIFIER IS "L" LEVEL, CORRESPONDING REFRESH CIRCUIT IS MAINTAINED AT OFF STATE. |
| "L" DATA READ | IN "L" DATA READ OPERATION, BIT LINES ARE PRECHARGED TO "H" LEVEL, AND DATA OF MEMORY CELLS ARE TRANSFERRED TO BIT LINES BY ENABLING WORD LINE WL AT ONLY SELECTED ADDRESS. IN THIS CASE, SINCE POTENTIAL OF MEMORY CELLS 70 IS "L" LEVEL AND THAT OF BIT LINES IS "H" LEVEL, POTENTIAL OF MEMORY CELLS SHIFTS TOWARD "H" LEVEL, AND POTENTIAL OF BIT LINES SHIFTS TOWARD THE "L" LEVEL. WHEN MEMORY CELLS ARE ACTIVATED, SO THAT POTENTIAL VARIATION IS HALTED WHEN THEY BECOME EQUAL. THUS, DATA OF MEMORY CELLS IS DESTROYED ONCE WHEN WORD LINE WL IS ASSERTED. WHEN WORD LINE WL IS ENABLED, SENSE AMPLIFIERS ARE ENABLED SIMULTANEOUSLY, AND DATA IS TRANSFERRED TO OUTPUT CIRCUIT. WHEN OUTPUT OF SENSE AMPLIFIER IS "H" LEVEL, REFRESH CIRCUITS ARE ACTIVATED TO REWRITE "L" LEVEL DATA BACK INTO MEMORY CELLS VIA BIT LINES. THUS, THE DATA OF THE MEMORY CELLS ONCE DESTROYED IS REFRESHED, ENABLING READING OF THE DATA REPEATEDLY. |

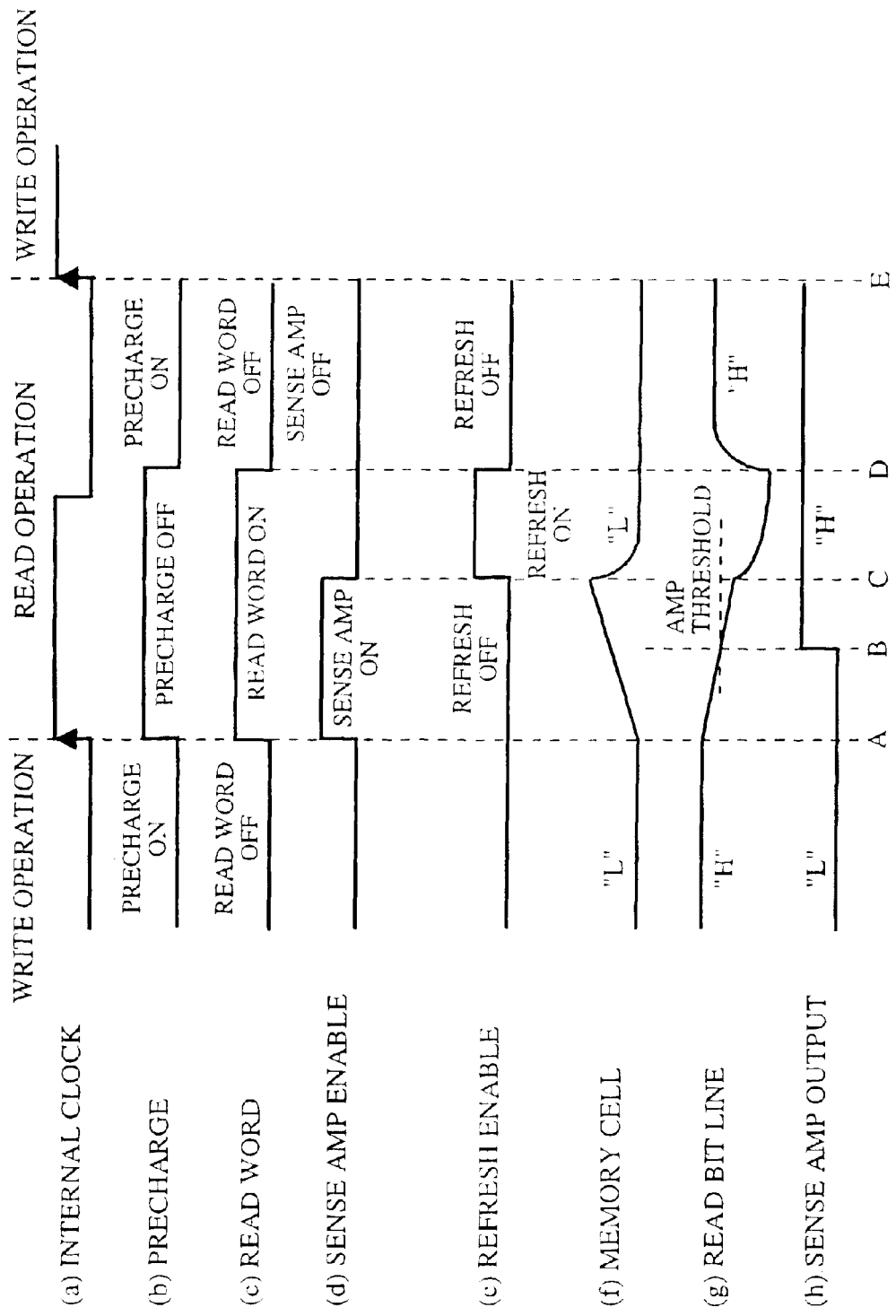

MULTIPORT MEMORY CIRCUIT COMPOSED OF 1TR-1C MEMORY CELLS

BACKGROUND OF THE INVENTION

1. Field of the Invention

The present invention relates to a 1Tr-1C (one-transistor and one-capacitor) multiport memory-circuit used as a two-port memory in which write and read clock signals are asynchronous, and particularly to a multiport memory circuit applicable to various purposes as a data buffer between devices with different operation speed such as a FIFO (First-In, First-Out) memory.

2. Description of Related Art

FIFO memories are used for various purposes as a data buffer between devices with different operation speed. The FIFO memory needs two ports because its write and read clock signals are asynchronous (see, prior art reference 1, for example). Accordingly, the conventional FIFO memories are composed of a 3Tr-1C-DRAM or 8Tr-SRAM.

Thus, the write and read clock signals are asynchronous in the conventional FIFO memory. Accordingly, writing to a specified memory cell is carried out using a write bit decoder and a write word decoder. Likewise, reading from a specified memory cell is carried out using a read bit decoder and a read word decoder. Thus, the conventional FIFO memory includes the two word decoders and two bit decoders for writing and reading, which prevents the size reduction in the memory circuit.

Since data in the conventional 3Tr-1C-DRAM memory cells is read nondestructively, the data can be read any number of times as long as the data is held. In addition, the 3Tr-1C-DRAM memory cell can be smaller in size than an 8Tr-1C-SRAM memory cell which will be described later, because it has a smaller number of transistors and capacitors per memory cell. However, since it includes a write selecting circuit at each address, when the number of bits (the number of the memory cells) per address is small, a relative area occupied by the write selecting circuit increases, thereby preventing the miniaturization of the memory cell. Furthermore, a refresh circuit, which is provided for solving the problem of data holding time of the DRAM, will prevent the miniaturization of the memory cell because of its occupying area.

The data in the conventional 8Tr-SRAM memory cells can also be read nondestructively, allowing the data to be read any number of times from the memory cells. In addition, the 8Tr-SRAM memory cells are free from the problem of the data holding because of the SRAM structure. However, they include a greater number of transistors per memory cell than the 3Tr-1C-DRAM memory cells, which prevents the miniaturization of the memory cell.

The following seven relevant references are cited and incorporated herein by reference.

[Reference 1]
Japanese patent application laid-open No. 2001-43674 (paragraph 19 and FIG. 2)

[Reference 2]
Japanese patent application laid-open No. 5-198168/1993 (paragraphs 18–21, and FIG. 1)

[Reference 3]
Japanese patent application laid-open No. 62-287498/1987 (bottom-right column on page 2 to bottom-right column on page 3, and FIG. 1)

[Reference 4]
Japanese patent application laid-open No. 5-206398/1993 (paragraphs 22–51, and FIGS. 1–3)

[Reference 5]
Japanese patent application laid-open No. 58-130494/1983 (top-right column on page 2 to top-left column on page 3, and FIG. 2)

[Reference 6]
Japanese patent application laid-open No. 10-283769/1998 (paragraphs 37–56, and FIGS. 1–4)

[Reference 7]
Japanese patent application laid-open No. 7-296585/1995 (paragraphs 10–19, and FIGS. 1–4)

With the foregoing configuration, the conventional FIFO memory must include two word decoders and two bit decoders for writing and reading because the clock signals for writing and reading are asynchronous. Thus, it has a problem of hampering the miniaturization of the memory cell.

In addition, the 3Tr-71C-DRAM memory cell has the following problems. First, since it requires one write selecting circuit (NOR gate) for each address, when the number of bits (the number of memory cells) per address is small, the relative area occupied by the write selecting circuits increases, which hinders the miniaturization of the memory cell. In addition, the refresh circuit, which is installed to solve the problem of the data holding time, also prevents the miniaturization of the memory cell because of the area it occupies.

Furthermore, since the 8Tr-SRAM memory cell includes a greater number of transistors per memory cell, it has a problem of hindering the miniaturization of the memory cell.

SUMMARY OF THE INVENTION

The present invention is implemented to solve the foregoing problems. It is therefore an object of the present invention to provide a multiport memory circuit composed of 1Tr-1C memory cells capable of reducing the area of the memory cell, thereby being able to reduce the chip size.

According to the present invention, there is provided a multiport memory circuit carrying out its write operation and read operation with reference to an internal clock signal with a frequency equal to or greater than double a higher frequency of a write clock signal and read clock signal. Thus, only the bit decoder circuit and word decoder circuit are enough as the decoder circuits needed for the write and read operation, thereby offering an advantage of being able to reduce the chip size.

BRIEF DESCRIPTION OF THE DRAWINGS

FIG. 5 is a table summarizing "H" data write operation, "L" data write operation, "H" data read operation and "L" data read operation of the embodiment 1 of the 1Tr-1C multiport memory circuit in accordance with the present invention;

FIG. 6 is a timing chart illustrating the "L" data read operation of the embodiment 1 of the 1Tr-1C multiport memory circuit in accordance with the present invention;

DETAILED DESCRIPTION OF THE PREFERRED EMBODIMENTS

The invention will now be described with reference to the accompanying drawings.

Embodiment 1

Figure 1:
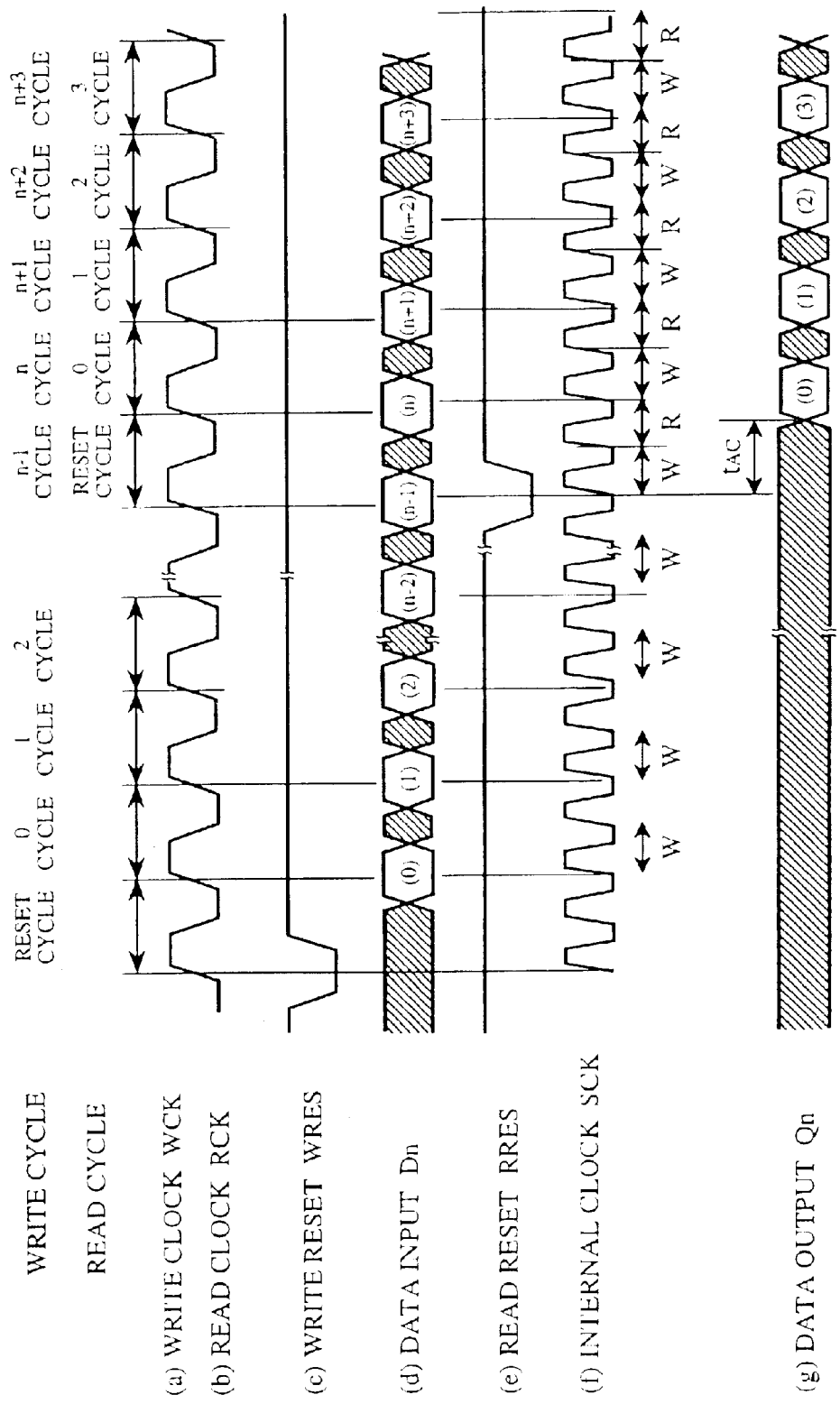
FIG. 1 is a timing chart illustrating the operation of an embodiment 1 of a 1Tr-1C multiport memory circuit in accordance with the present invention, in which the write clock signal WCK and read clock signal RCK have the same frequency and are synchronized with each other.
Figure 2:
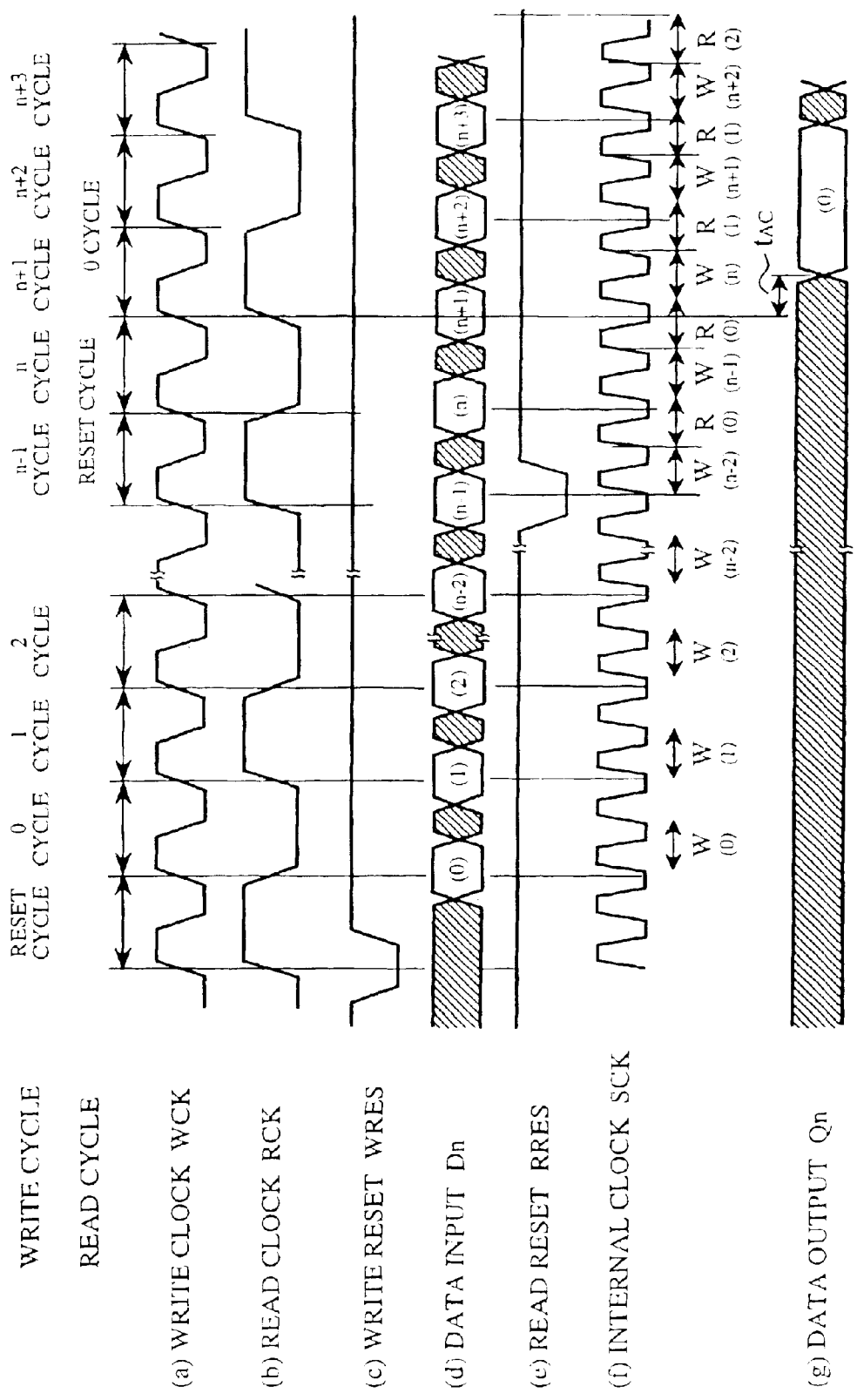
FIG. 2 is a timing chart illustrating the operation of the embodiment 1 of the 1Tr-1C multiport memory circuit in accordance with the present invention seen from the outside, in which the write clock signal WCK and read clock signal RCK have different frequencies, and the read clock signal RCK is slower (lower in frequency) than the write clock signal WCK.
Figure 3:
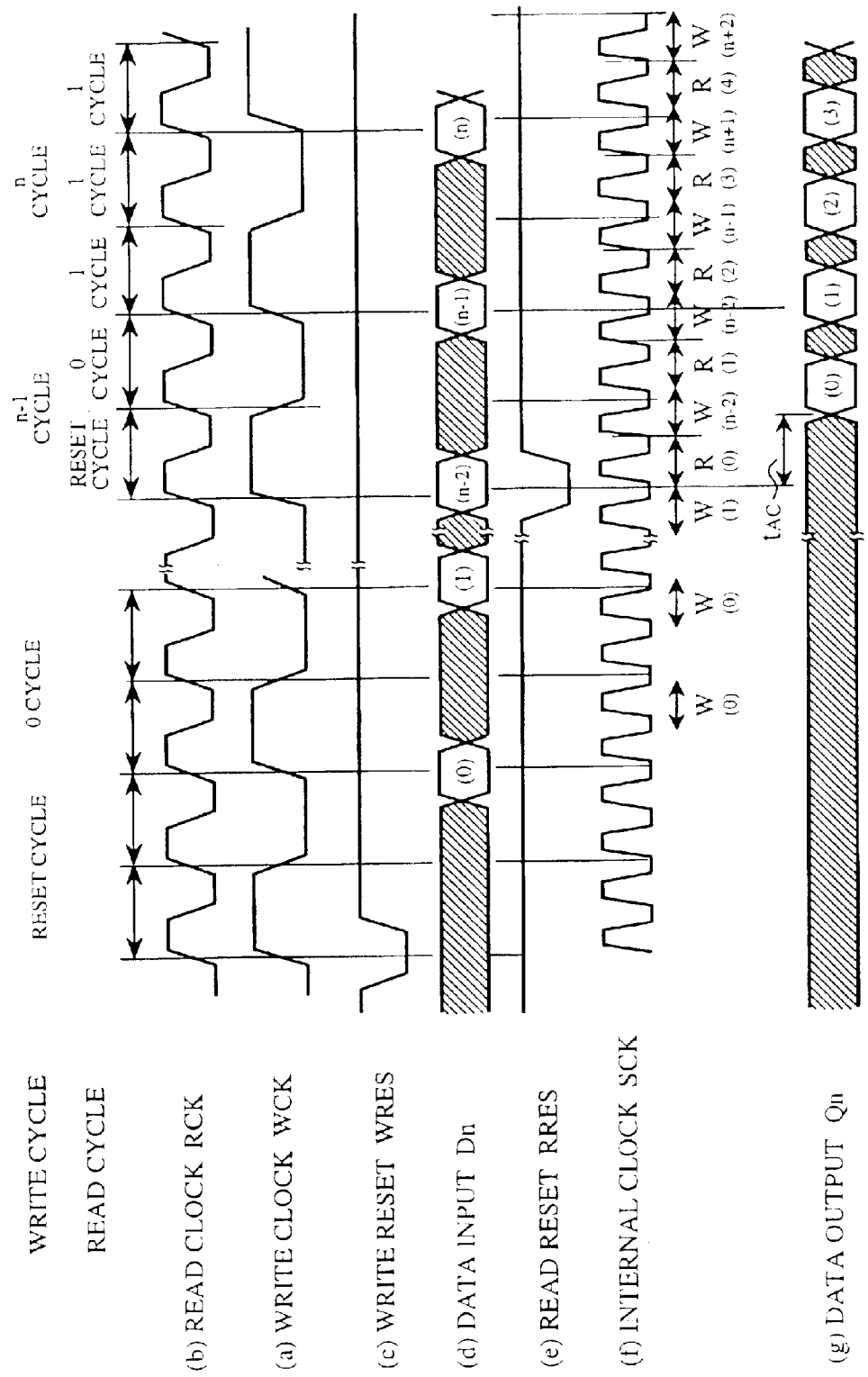
FIG. 3 is a timing chart illustrating the operation of the embodiment 1 of the 1Tr-1C multiport memory circuit in accordance with the present invention seen from the outside, in which the write clock signal WCK and read clock signal RCK have different frequencies, and the write clock signal WCK is slower (lower in frequency) than the read clock signal RCK.

FIGS. 1–3 are timing charts illustrating the operation of the embodiment 1 of the 1Tr-1C multiport memory circuit in accordance with the present invention seen from the outside. In FIGS. 1–3, the horizontal axis represents time. In these figures, (a) illustrates a waveform of a write clock signal WCK; (b) illustrates a waveform of a read clock signal RCK; (c) illustrates a waveform of a write reset signal WRES; (d) illustrates a waveform of a data input Dn; (e) illustrates a waveform of a read reset signal RRES; (f) illustrates a waveform of an internal clock signal SCK; and (g) illustrates a waveform of a data output Qn.

FIG. 1 illustrates the operation when the write clock signal WCK and read clock signal RCK have the same frequency and are synchronized with each other; FIG. 2 illustrates the operation when the write clock signal WCK and read clock signal RCK have different frequencies, and the read clock signal RCK is slower (lower in frequency) than the write clock signal WCK; and FIG. 3 illustrates the operation when the write clock signal WCK and read clock signal RCK have different frequencies, and the write clock signal WCK is slower (lower in frequency) than the read clock signal RCK.

The multiport memory carries out its write and read operation with reference to the write clock signal WCK and read clock signal RCK.

The embodiment 1 of the multiport memory carries out the write and read operation, which is internal operation, with reference to the internal clock signal SCK that is synchronized with the external clock signal WCK or RCK, and has double the frequency of the WCK or RCK. To complete the write and read operation during a single cycle of the external clock signal WCK or RCK, the internal clock signal SCK conducts two-cycle operation. Specifically, it carries out the write operation in a first cycle, and read operation in a second cycle.

In FIGS. 2 and 3, the internal clock signal SCK is generated with reference to the clock signal with a higher frequency between the write clock signal WCK and read clock signal RCK: the write clock signal WCK in FIG. 2, and the read clock signal RCK in FIG. 3. Thus, the internal clock signal SCK has double the frequency of the clock signal with the higher frequency.

Figure 4:
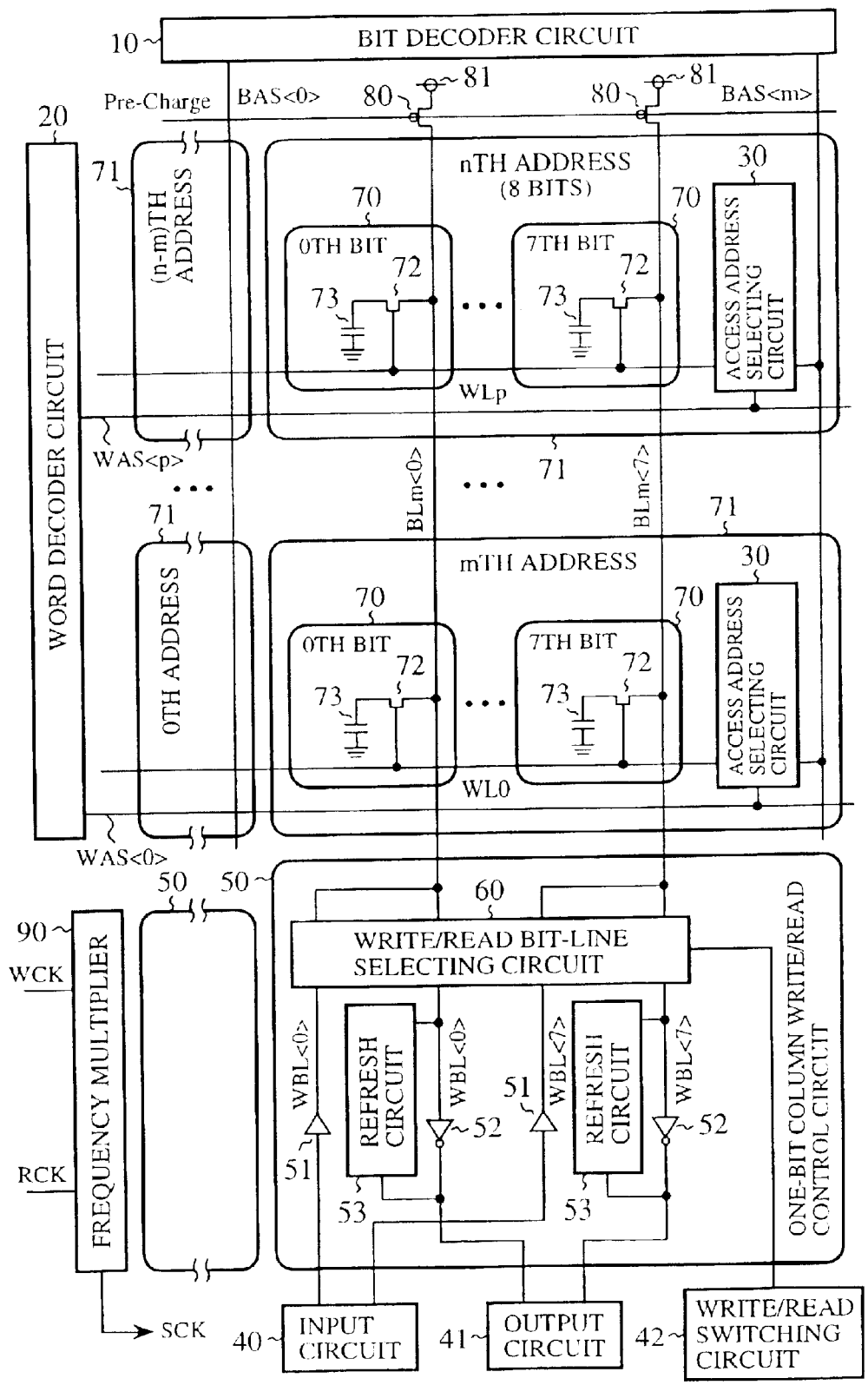
FIG. 4 is a block diagram showing a configuration of the embodiment 1 of the 1Tr-1C multiport memory circuit in accordance with the present invention.

FIG. 4 is a block diagram showing a configuration of the embodiment 1 of the 1Tr-1C multiport memory circuit in accordance with the present invention. In FIG. 4, a bit decoder circuit 10 designates write bits or read bits, and a word decoder circuit 20 designates write words and read words. An access address selecting circuit 30 is provided for each word 71 corresponding to an address. It selects an access address in response to a bit selecting signal BAS<0>–BAS<m> (Bit Access Select: called "BAS" from now on) fed from the bit decoder circuit 10 and to a word selecting signal WAS<0>–WAS<p> (Word Access Select: called "WAS" from now on) fed from the word decoder circuit 20.

An input circuit 40 supplies the FIFO memory with input data to be written to memory cells 70 via write drivers 51. An output circuit 41 outputs data read from the memory cells 70 via sense amplifiers 52.

A write/read switching circuit 42 supplies a write/read bit-line selecting circuit 60 with a write/read switching signal. A one-bit column write/read control circuit 50, which is provided for each column of the words 71, controls read and write of each memory cell 70 (one bit) in each word 71 in the column.

The write drivers 51 write the input data fed from the input circuit 40 to the corresponding memory cells 70 via the write/read bit-line selecting circuit 60. The sense amplifiers 52 transfer the data read from the memory cells 70 to the output circuit 41 via the write/read bit-line selecting circuit 60. The refresh circuits 53 refresh the data in the corresponding word 71. The write driver 51, sense amplifier 52 and refresh circuit 53 are provided for each column of the memory cells 70, in the one-bit column write/read control circuit 50. The write/read bit-line selecting circuit 60, which is provided for each one-bit column write/read control circuit 50, selects memory cells 70 to be read or written in the corresponding word 71 in the column. The one-bit column write/read control circuit 50 includes the write drivers 51, sense amplifiers 52, refresh circuits 53, and write/read bit-line selecting circuit 60.

The word 71 includes eight memory cells 70 from 0th bit to 7th bit, and the access address selecting circuit 30. The total of n=(m+1)×(p+1) words 71 constitute a memory cell array with (m+1) words in row (horizontal direction of FIG. 4) and (p+1) words in column (vertical direction of FIG. 4).

Each NMOS transistor 72 has its drain connected to corresponding one of bit lines BLm<0>–BLm<7> (called "BLm" from now on), and its gate to corresponding one of word lines WL0–WLp (called "WL" from now on). Each capacitor 73 has its first terminal connected to the source of the corresponding NMOS transistor 72, and its second terminal connected to the ground potential GND. The memory cells 70 are each composed of the NMOS transistor 72 and capacitor 73.

Each PMOS transistor 80 has its source connected to a precharge voltage 81, its gate to a precharge signal line (Pre-Charge), and its drain to a corresponding one of bit lines BLm. The PMOS transistors 80 and precharge voltage 81 are provided for each bit line BLm.

A frequency multiplier 90 receives the write clock signal WCK and read clock signal RCK, and outputs the internal clock signal SCK. It doubles the higher frequency of the write clock signal WCK and read clock signal RCK, and outputs the internal clock signal with the frequency doubled. As described above in connection with FIGS. 1–3, the write and read operation are carried out with reference to the internal clock signal with double the frequency. Accordingly, the write and read operation is completed in the one cycle of the external clock signal WCK or RCK.

Carrying out the write and read operation with reference to the double-frequency internal clock signal enables the write and read operation to be completed within one cycle of the external clock signal WCK or RCK. As a result, only the bit decoder circuit 10 and word decoder circuit 20 are enough as the decoder circuits needed for the write and read operation, thereby being able to reduce the chip size.

In FIG. 4, although the BLm<0> and BLm<7> are shown, the intermediate BLm<1>–BLm<6> are omitted to simplify the drawing. In addition, the memory cells 70, write drivers 51, refresh circuit 53, and sense amplifiers 52 corresponding to the BLm<1>–BLm<6> are also omitted. Moreover, although the internal clock signal SCK output from the frequency multiplier 90 are supplied to the bit decoder circuit 10, word decoder circuit 20, write/read switching circuit 42, input circuit 40 and output circuit 41, the signal lines of the internal clock signal are omitted to simplify the drawing.

Next, the operation of the present embodiment 1 will be described.

The 1Tr-1C multiport memory circuit with the foregoing configuration carries out the write and read operation as follows. Assume that the bit decoder circuit 10 generates the bit selecting signal BAS<m>, and the word decoder circuit 20 generates the word selecting signal WAS<p>, so that the word 71 at the nth address is selected. In this case, the access address selecting circuit 30 at the nth address enables the word line WLp to activate the memory cells 70 of the address (to bring the NMOS transistors 72 of the memory cells 70 into conduction).

In addition, the write/read switching circuit 42 selects the write or read operation, and then the write/read bit-line selecting circuit 60 decides whether to use the bit lines BLm for the write or read operation. In the write operation, the write drivers 51 supply the data to the bit lines BLm. In contrast, the bit lines BLm supply the read data to the sense amplifiers 52 in the read operation. When the selected address includes a plurality of bits (eight bits in this case), that is, when each address includes a plurality of memory cells, the write or read operation is carried out for the word 71.

The operation will now be described by way of example of the words in the mth column (the right-side word column from mth to nth address of FIG. 4). Although only the mth bit lines (BLm<0>–BLm<7>) are shown in FIG. 4, the zeroth to mth columns include bit lines BL0<0>–BL0<7> to bit lines BLm<0>–BLm<7>, respectively.

Next, the "H" data write operation, "L" data write operation, "H" data read operation and "L" data read operation will be described.

FIG. 5 is a table summarizing the "H" data write operation, "L" data write operation, "H" data read operation and "L" data read operation from top to bottom, respectively.

FIG. 6 is a timing chart illustrating the operation of the "L" read, in which the horizontal axis represents time. FIG. 6(a) illustrates a waveform of the internal clock signal SCK; FIG. 6(b) illustrates a waveform of the precharge signal; FIG. 6(c) illustrates a waveform of the read word signal; FIG. 6(d) illustrates a waveform of a sense amplifier enable signal; FIG. 6(e) illustrates a waveform of a refresh enable signal; FIG. 6(f) illustrates a waveform of a potential of the memory cell; FIG. 6(g) illustrates a waveform of a potential of the bit line; and FIG. 6(h) illustrates a waveform of the output of the sense amplifier.

As explained in the first section of FIG. 5, the "H" data write operation is carried out by writing, via the write drivers 51 and bit lines BLm, the "H" data from the input circuit 40 to the memory cells 70 in the word 71 selected as described above.

As explained in the second section of FIG. 5, the "L" data write operation is carried out by writing, via the write drivers 51 and bit lines BLm, the "L" level data from the input circuit 40 to the memory cells 70 in the word 71 selected.

As explained in the third section of FIG. 5, the "H" data read operation is carried out as follows. First, the bit lines BLm are precharged to the "H" level by placing the bit lines BLm at the precharge voltage 81 by bringing the PMOS transistors 80 into conduction by a precharge signal (Pre-Charge). Second, the data of the memory cells 70 in the selected word 71 are transferred to the bit lines BLm by activating the memory cells 70 by enabling the word line WL (one of the word lines WL0–WLp) of the word. In this case, since the potential of the bit lines BLm and that of the memory cells 70 are both "H" level, they do not vary. Accordingly, the data of the memory cells 70 is not destroyed, maintaining the "H" level. When the word line WL is enabled, the sense amplifiers 52 are enabled simultaneously so that the "L" level data (inverted data of the "H" data because the sense amplifiers 52 operates as an inverter) is transferred to the output circuit 41 via the write/read bit-line selecting circuit 60 and sense amplifiers 52. When the output of the sense amplifier 52 is "L" level, the corresponding refresh circuit 53 is maintained at the OFF state (nonconducting state).

As explained in the fourth section of FIG. 5, the "L" read is carried out as follows. First, the bit lines BLm are precharged to the "H" level by supplying the bit lines BLm with the precharge voltage 81 by activating the PMOS transistors 80 in response to the precharge signal (Pre-Charge) (before time A of FIG. 6). Second, one of the word lines WL0–WLP connected to the memory cells is enabled in the selected word (time A of FIG. 6), so that the data of the memory cells 70 are transferred to the bit lines BLm (also time A of FIG. 6). In this case, since the potential of the memory cells 70 is "L" level and that of the bit lines BLm is "H" level, when the memory cells 70 are activated, the potential of the memory cells 70 shifts toward the "H" level, and the potential of the bit lines BLm shifts toward the "L" level, so that the potential variation continues until they become equal (time C of FIG. 6). Thus, the data of the memory cells 70 is destroyed once when the word line WL is asserted.

On the other hand, the sense amplifiers 52 are enabled at the same time when the word line WL is activated (time A of FIG. 6). The outputs of the sense amplifiers 52 are kept "L" level until the potential of the bit lines BLm, which shifts toward the "L" level, reaches the threshold of the amplifiers (from time A to B of FIG. 6). When the potential of the bit lines BLm falls below the threshold value of the amplifiers, the output of the sense amplifiers 52 becomes "H" level (from time B onward of FIG. 6). After the "H" level data (inverted data of the "L" data) of the output of the sense amplifiers is transferred to the output circuit 41, the refresh circuits 53 are activated and the sense amplifiers 52 are disabled (time C of FIG. 6). The refresh circuits 53 write the "L" level data to the memory cells 70 via the bit lines BLm (from time C onward of FIG. 6). Thus, the data of the memory cells 70 once destroyed is refreshed, enabling the repeated data read. After the "L" level data is rewritten to the memory cells 70, the bit lines BLm are precharged to the "H" level (time D and E of FIG. 6).

In the read operation in the third and fourth sections of FIG. 5, the word column to be read is selected by the bit selecting signal BAS supplied from the bit decoder circuit 10 via the access address selecting circuit 30, so that only the selected word column undergoes the read operation. Thus performing the read operation on only the selected word column can reduce the power consumption.

The present embodiment 1, using the 1Tr-1C configuration rather than the 3Tr-1C-DRAM or 8Tr-SRAM as the memory cells, can reduce the area of the memory cells, thereby being able to reduce the chip size.

Although the present embodiment 1 sets the frequency of the internal clock signal SCK at double the frequency of the external write clock signal WCK and read clock signal RCK, this is not essential. For example, a frequency such as four times or eight times the frequency of the external clock signal can also be used.

In addition, although the present embodiment 1 employs the 1Tr-1C-structure as the memory cells, other types of memory cells such as the 3Tr-1C or 8T memory cells can also be used, in which the frequency of the internal clock signal can be set equal to or greater than double the higher frequency of the external write clock signal WCK and read clock signal RCK.

As described above, the present embodiment 1 of the multiport memory circuit comprises: the access address selecting circuit 30 for activating the word line WL of the address selected by the word selecting signal WAS and bit selecting signal BAS to be subjected to the write or read operation; the plurality of memory cells 70 each including the write access transistor 72 activated by the word line WL and charge storage capacitor 73; the sense amplifiers 52 for amplifying the data on the read bit lines RBL; the write/read switching circuit 42 for selecting the write or read operation; the refresh circuits 53 that are activated when the data of the memory cells 70 are at the "L" level to rewrite the "L" level data to the memory cells 70 via the read bit lines RBL; the write/read bit-line selecting circuit 60 for selecting one of transferring the write data to the bit lines BL and transferring the data on the bit lines BL to the sense amplifiers 52 under the control of the write/read switching circuit 42; the bit line precharge circuit 80 and 81 for precharging the bit lines BL; and the frequency multiplier 90 for generating the internal clock signal SCK that is used as the reference clock signal of the read and write operation, and has the frequency equal to or greater than double the higher frequency of the write clock signal WCK and read clock signal RCK.

The memory cells 70 of the present embodiment 1 of the multiport memory circuit each consists of the 1Tr-1C-memory cell composed of the write access transistor 72 and the capacitor 73 connected to the bit line BL when the write access transistor 72 conducts.

As described above, the present embodiment 1 is configured such that it carries out the write and read operation with reference to the double-frequency internal clock signal. Thus, it requires only the bit decoder circuit 10 and word decoder circuit 20 as the decoder circuits for the write and read operation, thereby being able to reduce the chip size.

The present embodiment 1 offers an advantage of being able to reduce the chip size because the memory cells employ the 1Tr-1C configuration capable of reducing the area of the memory cells.

The present embodiment 1 offers an advantage of being able to reduce the power consumption because the access address selecting circuit 30 enables the read operation of only the word column selected by the bit selecting signal BAS.

Embodiment 2

Figure 7:
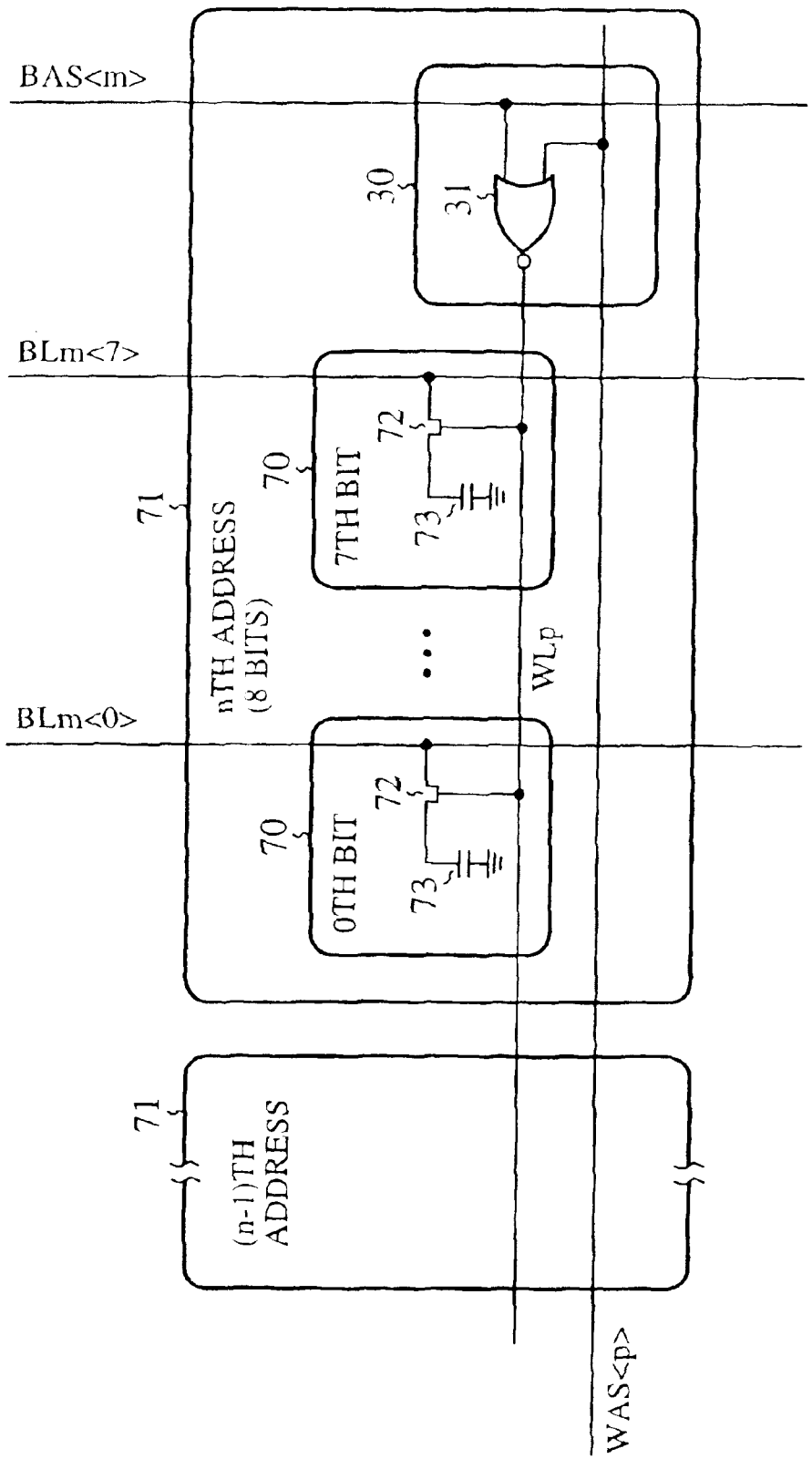
FIG. 7 is a block diagram showing a configuration of an access address selecting circuit 30 of an embodiment 2 of the 1Tr-1C multiport memory circuit in accordance with the present invention.

FIG. 7 is a circuit diagram showing a configuration of the access address selecting circuit 30 of an embodiment 2 of the 1Tr-1C multiport memory circuit in accordance with the present invention. In FIG. 7, a NOR gate 31 constitutes the access address selecting circuit 30 provided for each word 71. The NOR gate 31 has its first input supplied with the corresponding bit selecting signal BAS (BAS<m>), and its second input supplied with the corresponding word selecting signal WAS (WAS<p>). The word line WL (WLp) connected to the output of the NOR gate 31 is connected to the gates of the individual write access transistors 72 in the word 71. In FIG. 7, the same reference numerals as those of FIG. 4 designate the same or like portions to those of FIG. 4.

The present embodiment 2 employs the access address selecting circuit 30 as shown in FIG. 7 in place of the access address selecting circuit 30 of the foregoing embodiment 1.

Next, the operation of the present embodiment 2 will be described.

In this configuration, the NOR gate 31 serving as the access address selecting circuit 30 outputs on the word line WL a high level enabling signal when both the bit selecting signal BAS and word selecting signal WAS are at the active "L" level.

Accordingly, the potential of the gates of the memory cells 70 becomes "H" level only when both the bit selecting signal BAS and word selecting signal WAS are at the active "L" level, thereby activating the NMOS transistors 72.

In the present embodiment 2, the access address selecting circuit 30 is composed of the 2-input NOR gate 31 so that it activates the NMOS transistors 72 of the memory cells 70 only when both the bit selecting signal BAS and word selecting signal WAS are placed at the active "L" level. As a result, the present embodiment 2 can prevent the data of the unselected memory cells 70 from being destroyed by noise or the like on the bit selecting signal BAS and word selecting signal WAS.

As described above, the present embodiment 2 of the multiport memory circuit has the access address selecting circuit 30 consisting of the 2-input NOR gate 31 that supplies the word line WL with the output signal when the bit selecting signal BAS and word selecting signal WAS are input.

As described above, the present embodiment 2 has the access address selecting circuit 30 consisting of the 2-input NOR gate 31. Thus, it offers an advantage of being able to prevent the data in the memory cells 70 in the unselected addresses from being destroyed by the noise or the like on the bit selecting signal BAS or word selecting signal WAS.

Embodiment 3

Figure 8:
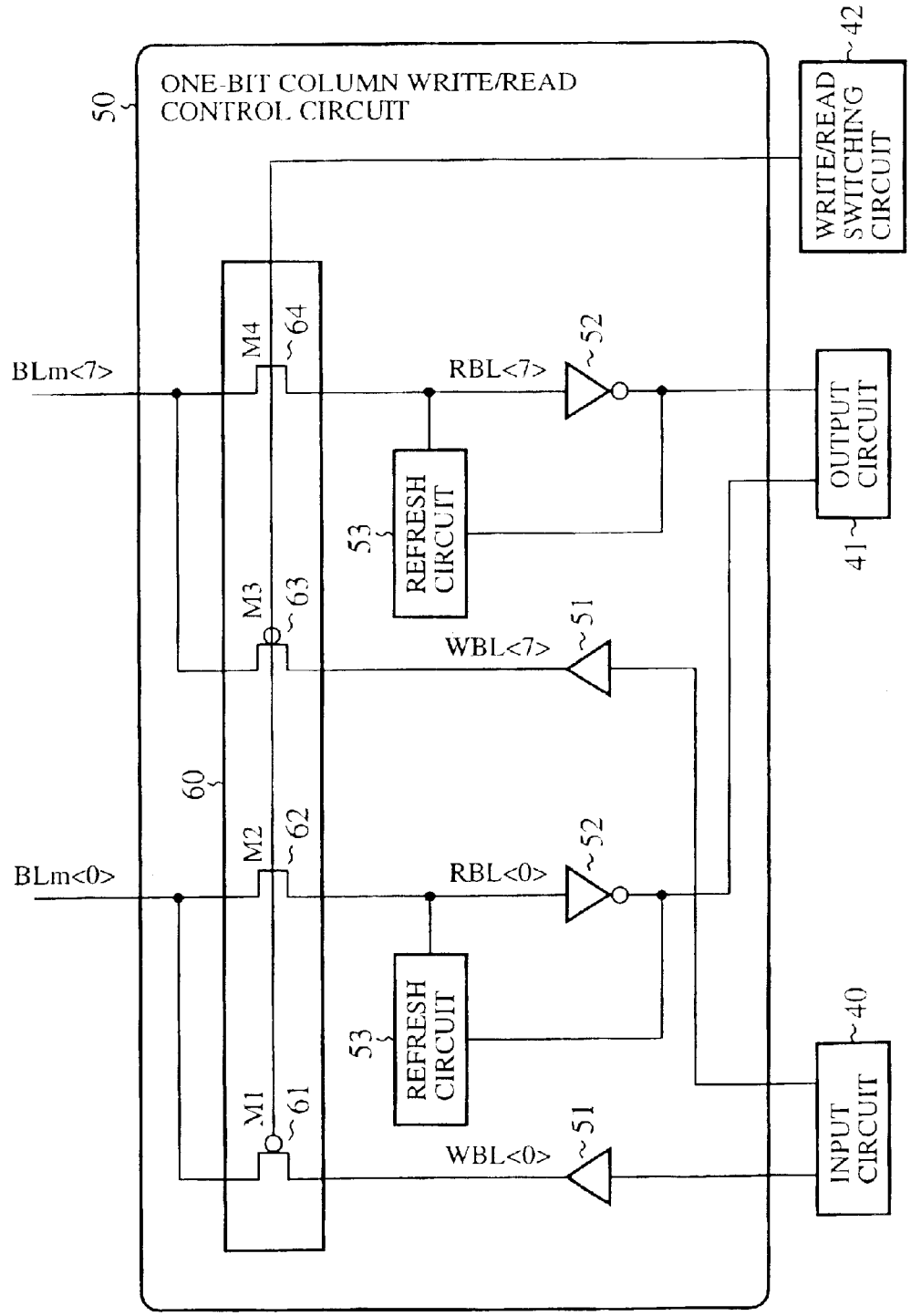
FIG. 8 is a block diagram showing a configuration of a write/read bit-line selecting circuit 60 of an embodiment 3 of the 1Tr-1C multiport memory circuit in accordance with the present invention.

FIG. 8 is a block diagram showing a configuration of the write/read bit-line selecting circuit 60 of an embodiment 3 of the 1Tr-1C multiport memory circuit in accordance with the present invention. In FIG. 8, a PMOS transistor 61 has its source connected to the corresponding bit line BLm<0>, its drain connected to the write bit line WBL<0> from the write driver 51, and its gate connected to the output line (write/read switching signal line) of the write/read switching circuit 42.

An NMOS transistor 62 has its drain connected to the corresponding bit line BLm<0>, its source connected to the read bit line RBL<0> connected to the input of the sense amplifier 52, and its gate connected to the output line (write/read switching signal line) of the write/read switching circuit 42.

A PMOS transistor 63 has its source connected to the corresponding bit line BLm<7>, its drain connected to the write bit line WBL<7> from the write driver 51, and its gate connected to the output line (write/read switching signal line) of the write/read switching circuit 42.

An NMOS transistor 64 has its drain connected to the corresponding bit line BLm<7>, its source connected to the read bit line RBL<7> connected to the input of the sense amplifier 52, and its gate connected to the output line (write/read switching signal line) of the write/read switching circuit 42.

In FIG. 8, only the BLm<0> and BLm<7> corresponding to the zeroth- and seventh-bit memory cells 70 are drawn, with omitting the BLm<1>–BLm<6> corresponding to the first- to sixth-bit memory cells 70. Accordingly, PMOS transistors and NMOS transistors corresponding to the BLm<1>–BLm<6> are also omitted in FIG. 8. Thus, the write/read bit-line selecting circuit 60 consists of the PMOS transistors 61–63 and NMOS transistors 62–64 in FIG. 8.

The present embodiment 3 of the 1Tr-1C multiport memory circuit employs the write/read bit-line selecting circuit 60 of FIG. 8 in place of its counterpart of the embodiment 1 of the 1Tr-1C multiport memory circuit.

Next, the operation of the present embodiment 3 will be described.

The 1Tr-1C multiport memory circuit with the foregoing configuration carries out the write operation to the memory cells 70 when the output of the write/read switching circuit 42 is at the "L" level. Specifically, it activates the PMOS transistor (M1) 61 and PMOS transistor (M3) 63 of the write/read bit-line selecting circuit 60 so that the data of the input circuit 40 is transferred to the bit lines BLm via the write drivers 51. Thus, the data is written to the memory cells 70.

In contrast, when the output of the write/read switching circuit 42 is at the "H" level, the read operation from the memory cells 70 is carried out. Specifically, it activates the NMOS transistor (M2) 62 and NMOS transistor (M4) 64 of the write/read bit-line selecting circuit 60 so that the data on the bit lines BLm is transferred to the output circuit 41 via the sense amplifiers 52. Thus, the data is read from the memory cells 70.

The present embodiment 3 can achieve the switching between the write and read operation using only one signal line, the output line of the write/read switching circuit 42, by configuring the write/read bit-line selecting circuit 60 from the PMOS transistors 61–63 and the NMOS transistors 62–64. In this case, the PMOS transistors 61–63 carry out the write operation by transferring the data output from the write drivers 51 to the bit lines BLm when the output of the write/read switching circuit 42 is at the "L" level. On the other hand, the NMOS transistors 62–64 carry out the read operation by transferring the data on the bit lines BLm to the sense amplifiers 52 when the output of the write/read switching circuit 42 is at the "H" level.

The present embodiment 3 of the multiport memory circuit is configured such that the write/read bit-line selecting circuit 60 of the embodiment 1 of the multiport memory circuit comprises the PMOS transistors 61–63 for carrying out the write operation by transferring the data output from the write drivers 51 to the bit lines BLm when the output of the write/read switching circuit 42 is at the "L" level, and the NMOS transistors 62–64 for carrying out the read operation by transferring the data on the bit lines BLm to the sense amplifiers 52 when the output of the write/read switching circuit 42 is at the "H" level.

Thus, the write/read bit-line selecting circuit 60 of the present embodiment 3 includes the PMOS transistors 61–63 activated in response to the "L" level output of the write/read switching circuit 42, and the NMOS transistors 62–64 activated in response to its "H" level output. Thus, it can achieve the switching between the write and read operation through only one signal line, the output line of the write/read switching circuit 42, offering an advantage of being able to reduce the chip size.

Embodiment 4

Figure 9:
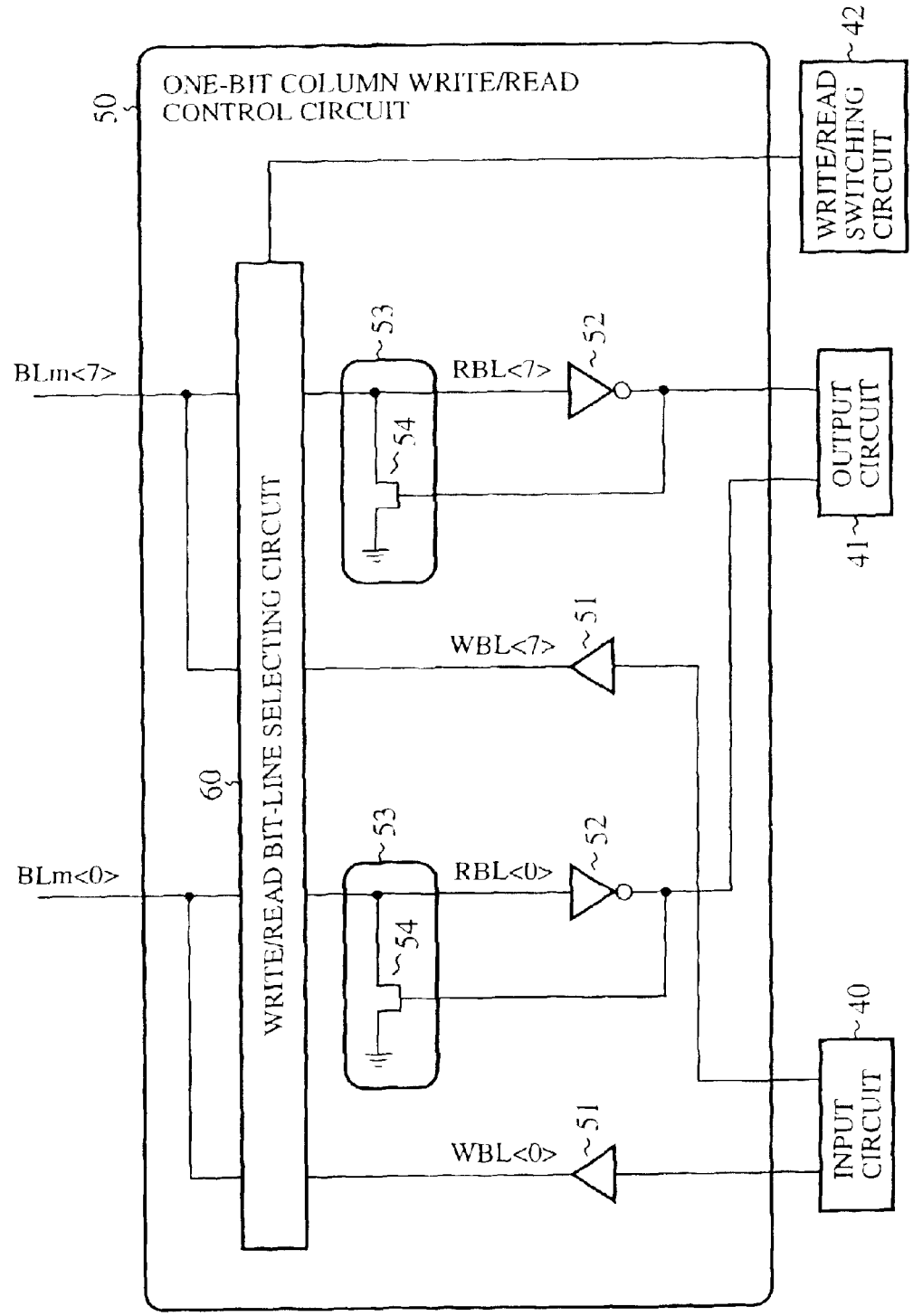
FIG. 9 is a block diagram showing a configuration of a refresh circuit 53 of an embodiment 4 of the 1Tr-1C multiport memory circuit in accordance with the present invention.

FIG. 9 is a circuit diagram showing a configuration of the refresh circuits 53 of an embodiment 4 of the 1Tr-1C multiport memory circuit in accordance with the present invention. In FIG. 9, each refresh circuit 53 consists of an NMOS transistor 54 provided for each bit line BLm. Each NMOS transistor 54 has its gate connected to the output of the corresponding sense amplifier 52, its drain connected to the corresponding read bit line RBL (one of the RBL<0>–RBL<7>), and has its source connected to the ground potential (GND). In FIG. 9, the same reference numerals as those of FIG. 4 designate the same or like portions to those of FIG. 4.

In FIG. 9, only the BLm<0> and BLm<7> corresponding to the zeroth- and seventh-bit memory cells 70 are drawn, with omitting the BLm<1>–BLm<6> corresponding to the first- to sixth-bit memory cells 70. Accordingly, the write drivers 51, refresh circuits 53, and sense amplifiers 52 corresponding to the BLm<1>–BLm<6> are also omitted from FIG. 9.

The present embodiment 4 of the 1Tr-1C multiport memory circuit employs the refresh circuits 53 of FIG. 9 in place of their counterparts of the embodiment 1 of the 1Tr-1C multiport memory circuit.

As described above in connection with the foregoing embodiment 1, when reading "L" level data from the memory cell 70, the potential of the memory cell 70 shifts toward the "H" level and the potential of the bit line BLm shifts toward the "L" level. Then, the potential variation stops at the point the two potentials become equal (time C of FIG. 6), leading to the destructive read out of the memory cells 70. In view this, the refresh circuits 53 of the present embodiment 4 each consist of the pull-down NMOS transistor 54 interposed between the output of the sense amplifier 53 and the ground GND so that the NMOS transistors 54 rewrite the "L" level data to the memory cells 70 via the bit lines to carry out the refresh operation.

Next, the operation of the present embodiment 4 will be described.

In the 1Tr-1C multiport memory circuit with the configuration described above, the NMOS transistors 54 are activated in response to the "H" level output from the sense amplifiers 52 (from time B onward of FIG. 6) and the sense amplifiers 52 are inactivated (time C of FIG. 6). In response to this, the "L" level data is rewritten to the memory cells 70 via the bit lines BLm (from time C onward of FIG. 6). Thus, the data of the memory cells 70 once destroyed is recovered, thereby enabling repeated reading.

In the present embodiment 4, the refresh circuits 53 each consist of the pull-down NMOS circuit (NMOS transistor 54) interposed between the output of the sense amplifier 52 and the ground GND. The NMOS transistors 54, which rewrite the "L" level data to the memory cells 70 via the bit lines, enable the repeated reading of the data.

The present embodiment 4 of the multiport memory circuit employs the refresh circuits 53, which consist of the NMOS transistors 54 for transferring the ground potential GND to the read bit lines RBL in response to the "H" level output from the sense amplifiers 52, in place of their counterparts of the foregoing embodiment 1 of the multiport memory circuit.

As described above, the refresh circuits 53 of the present embodiment 4 consist of the NMOS transistors 54 for transferring the ground potential GND to the read bit lines RBL in response to the "H" level output from the sense amplifiers 52. As a result, it offers an advantage of being able to refresh the "L" level data of the memory cells 70, thereby enabling the repeated reading of the data.

Embodiment 5

Figure 10:
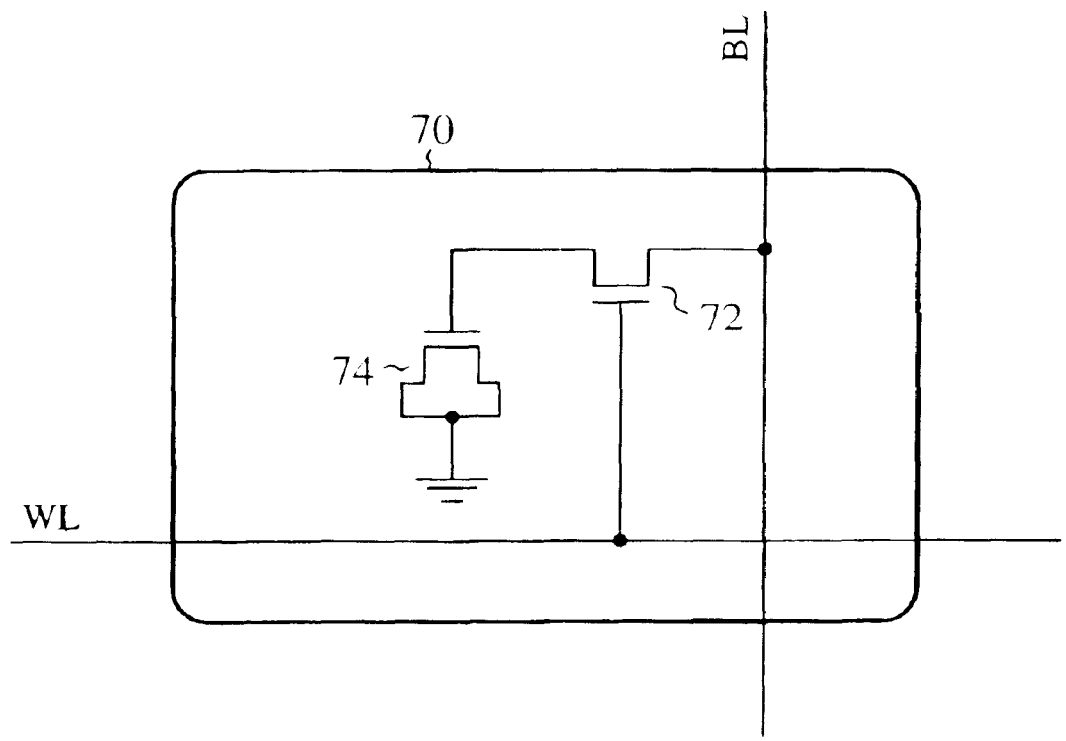
FIG. 10 is a circuit diagram showing a configuration of a memory cell 70 of an embodiment 5 of the 1Tr-1C multiport memory circuit in accordance with the present invention.

FIG. 10 is a circuit diagram showing a configuration of a memory cell 70 of an embodiment 5 of the 1Tr-1C multiport memory circuit in accordance with the present invention. In FIG. 10, the NMOS transistor 72 has its drain connected to the bit line BL, and its gate connected to the word line WL. A MOS capacitor 74 has its gate connected to the source of the NMOS transistor 72, and its source and drain connected to the ground potential GND. The NMOS transistor 72 and MOS capacitor 74 constitute the memory cell 70.

The present embodiment 5 of the 1Tr-1C multiport memory circuit employs the memory cell 70 of FIG. 10 in place of its counterparts of the embodiment 1 of the 1Tr-1C multiport memory circuit.

Next, the operation of the present embodiment 5 will be described.

In the 1Tr-1C multiport memory circuit with the foregoing configuration, the MOS capacitors 74 functioning as the capacitors 73 of the memory cells 70 are charged to the potentials of the bit lines BLm via the NMOS transistors 72 in the write operation, thereby storing the write data. In the read operation, the data stored in the MOS capacitors 74 is transferred to the bit lines BLm via the NMOS transistors 72.

The embodiment 5, which employs the MOS capacitors that are cheaper than the 3Tr-1C-DRAM or 8Tr-SRAM as the capacitors of the memory cells, can utilize the so-called CMOS process, the inexpensive non-DRAM process, without using the expensive DRAM process. As a result, it can reduce the chip cost, and offers an advantage of being able to implement a system LSI enabling a large capacity multiport memory to be built into a common CMOS ASIC (application specific integrated circuit).

Although the present embodiment 5 is explained by way of example that employs the memory cells 70 as shown in FIG. 10 in place of their counterparts of the foregoing embodiment 1 of the 1Tr-1C multiport memory circuit, this is not essential. For example, the memory cells 70 of the present embodiment 5 as shown in FIG. 10 can be applied to the memory cells 70 of the foregoing embodiments 2–4 of the 1Tr-1C multiport memory circuit.

The present embodiment 5 of the multiport memory circuit employs the MOS capacitor 74 as the capacitor 73 of each memory cell 70 of the foregoing embodiments 1–4 of the multiport memory circuit.

As described above, according to the present embodiment 5, the capacitor 73 of each memory cell 70 is composed of the MOS capacitor 74. Accordingly, it can utilize the so-called CMOS process, the inexpensive non-DRAM process, without using the expensive DRAM process. As a result, it can reduce the chip cost, and offers an advantage of being able to implement a system LSI in which a large capacity multiport memory is built into an ordinary CMOS ASIC.

What is claimed is:

1. A multiport memory circuit comprising:

an access address selecting circuit for asserting a word line of an address that is selected by a word selecting signal and a bit selecting signal, and is subjected to one of write operation and read operation;

a plurality of memory cells, each of which includes a charge storing capacitor and a write access transistor switched on and off through the word line;

sense amplifiers for amplifying data on read bit lines;

a write/read switching circuit for selecting one of the write operation and read operation;

refresh circuits, each of which is asserted when data of a corresponding memory cell is at an "L" level to rewrite the "L" level data to the memory cell via the read bit line;

a write/read bit-line selecting circuit for selecting, under control of said write/read switching circuit, one of transferring write data to the bit lines and transferring data on the bit lines to said sense amplifiers;

a bit line precharge circuit for precharging the bit lines; and a frequency multiplier for generating an internal clock signal used as a reference clock signal of the read operation and write operation, a frequency of the internal clock signal being equal to or greater than double a higher frequency of a write clock signal and a read clock signal.

2. The multipart memory circuit according to claim 1, wherein said access address selecting circuit comprises a 2-input NOR gate for receiving the bit selecting signal and word selecting signal, and for supplying its output signal to the word line.

3. The multiport memory circuit according to claim 1, wherein said write/read bit-line selecting circuit comprises:

a first switching circuit that is turned on when the output of said write/read switching circuit is at the "L" level to carry out the write operation by transferring data output from write drivers to the bit lines; and a second switching circuit that is turned on when the output of said write/read switching circuit is at the "H" level to carry out the read operation by transferring the data on the bit lines to said sense amplifiers.

4. The multipart memory circuit according to claim 1, wherein each of said refresh circuits includes a MOS transistor that conducts when an output of the corresponding sense amplifier is at the "H" level to transfer ground potential to the corresponding read bit line.

5. The multipart memory circuit according to claim 1, wherein each of said memory cells consists of a 1Tr-1C-memory cell that comprises a write access transistor, and a capacitor connected to the bit line when said write access transistor conducts.

6. The multiport memory circuit according to claim 5, wherein the capacitor of said memory cell consists of a MOS capacitor.

* * * * *